(12) United States Patent
Wang et al.

(10) Patent No.: US 11,139,317 B2
(45) Date of Patent: Oct. 5, 2021

(54) ARRAY SUBSTRATE, TOUCH PANEL AND MANUFACTURING METHOD OF ARRAY SUBSTRATE

(71) Applicants: BOE Technology Group Co., Ltd., Beijing (CN); Beijing BOE Optoelectronics Technology Co., Ltd., Beijing (CN)

(72) Inventors: Haisheng Wang, Beijing (CN); Xue Dong, Beijing (CN); Hailin Xue, Beijing (CN); Xi Chen, Beijing (CN); Yingming Liu, Beijing (CN); Xiaoliang Ding, Beijing (CN); Weijie Zhao, Beijing (CN); Shengji Yang, Beijing (CN); Hongjuan Liu, Beijing (CN); Changfeng Li, Beijing (CN); Wei Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 317 days.

(21) Appl. No.: 14/892,419

(22) PCT Filed: Jun. 17, 2015

(86) PCT No.: PCT/CN2015/081640
§ 371 (c)(1),
(2) Date: Nov. 19, 2015

(87) PCT Pub. No.: WO2016/119373
PCT Pub. Date: Aug. 4, 2016

(65) Prior Publication Data
US 2016/0357310 A1    Dec. 8, 2016

(30) Foreign Application Priority Data
Jan. 27, 2015   (CN) .......................... 201510041311.7

(51) Int. Cl.
*G06F 3/044*   (2006.01)
*G06F 3/041*   (2006.01)
*H01L 27/12*   (2006.01)

(52) U.S. Cl.
CPC .......... *H01L 27/124* (2013.01); *G06F 3/0412* (2013.01); *G06F 3/0416* (2013.01);
(Continued)

(58) Field of Classification Search
CPC combination set(s) only.
See application file for complete search history.

(56) References Cited

U.S. PATENT DOCUMENTS 5,852,485 A * 12/1998 Shimada ........... G02F 1/134363
                                                 349/141
6,295,142 B1 * 9/2001 Watanabe ......... G02F 1/136204
                                                 345/100
(Continued)

FOREIGN PATENT DOCUMENTS

CN    102841466 A    12/2012
CN    102879959 A     1/2013
(Continued)

OTHER PUBLICATIONS

Sep. 24, 2015—International Search Report and Written Opinion Appn PCT/CN2015/081640 with English Tran.
(Continued)

*Primary Examiner* — William Boddie
*Assistant Examiner* — Alecia D English
(74) *Attorney, Agent, or Firm* — Banner & Witcoff, Ltd.

(57) ABSTRACT

An array substrate, a touch panel and a manufacturing method of an array substrate are provided. The array substrate includes a base substrate and a plurality of gate lines, a plurality of data lines, a common electrode layer and a plurality of pixel units arranged in an array disposed on the
(Continued)

base substrate. Each of the pixel units includes a plurality of sub-pixel units defined by gate lines and data lines disposed to intersect each other laterally and vertically. The common electrode layer includes a plurality of common electrode blocks that double as self-capacitance electrodes, each of the common electrode blocks is connected with at least one wire, and the wires are in the middle of sub-pixel units of a same column. The array substrate is configured to increase aperture ratio of pixel units.

19 Claims, 7 Drawing Sheets

(52) U.S. Cl.
CPC ........ G06F 3/0443 (2019.05); H01L 27/1255 (2013.01); *G06F 2203/04103* (2013.01); *G06F 2203/04111* (2013.01)

(56) References Cited

U.S. PATENT DOCUMENTS

| | | | | |
|---|---|---|---|---|
| 2003/0098939 | A1* | 5/2003 | Min | G02F 1/134363 349/141 |
| 2009/0201455 | A1* | 8/2009 | Murai | G02F 1/134363 349/139 |
| 2009/0218646 | A1* | 9/2009 | Okada | H01L 27/14676 257/428 |
| 2014/0085263 | A1 | 3/2014 | Yilmaz et al. | |
| 2015/0042599 | A1* | 2/2015 | Lukanc | G06F 3/0412 345/174 |
| 2015/0199044 | A1* | 7/2015 | He | G06F 3/04166 345/174 |
| 2016/0187694 | A1* | 6/2016 | Kim | G02F 1/1362 349/12 |
| 2016/0291721 | A1* | 10/2016 | Shepelev | G06F 3/044 |

FOREIGN PATENT DOCUMENTS

| | | |
|---|---|---|
| CN | 203217536 U | 9/2013 |
| CN | 103364983 A | 10/2013 |
| CN | 104536636 A | 4/2015 |

OTHER PUBLICATIONS

Jan. 22, 2017—(CN) First Office Action Appn 201510041311.7 with English Tran.

* cited by examiner ated on Jun. 17, 2015, designating the United States of America and claiming priority to Chinese Patent Application No. 201510041311.7 filed on Jan. 27, 2015. The present application claims priority to and the benefit of the above-identified applications and the above-identified applications are incorporated by reference herein in their entirety.

ARRAY SUBSTRATE, TOUCH PANEL AND MANUFACTURING METHOD OF ARRAY SUBSTRATE

The application is a U.S. National Phase Entry of International Application No. PCT/CN2015/081640 filed on Jun. 17, 2015, designating the United States of America and claiming priority to Chinese Patent Application No. 201510041311.7 filed on Jan. 27, 2015. The present application claims priority to and the benefit of the above-identified applications and the above-identified applications are incorporated by reference herein in their entirety.

TECHNICAL FIELD

Embodiments of the present invention relate to an array substrate, a touch panel and a manufacturing method of array substrate.

BACKGROUND

At present, touch panels formed by combining touch function and display function have been used more and more. Popular touch panels include resistive touch panels, capacitive touch panels and optical touch panels. Capacitive touch panels have become the main stream due to their high accuracy, multipoint touch and high touch resolution. Capacitive touch panels are generally classified into mutual-capacitance touch panels and self-capacitance touch panels. As compared to a mutual-capacitance touch panel, a self-capacitance touch panel is implemented with a single layer self-capacitance electrode structure having simple structure, which resulting in advantages such as low cost and hence is applied more popular.

SUMMARY

Embodiments of the present invention provide an array substrate, a touch panel and a manufacturing method of array substrate to increase aperture ratio of pixel units.

At least one embodiment of the present invention provides an array substrate comprising a base substrate and a plurality of gate lines, a plurality of data lines, a common electrode layer and a plurality of pixel units arranged in an array disposed on the base substrate, wherein each of the pixel units comprises a plurality of sub-pixel units defined by gate lines and data lines disposed to intersect each other laterally and vertically; the common electrode layer comprises a plurality of common electrode blocks that double as self-capacitance electrodes, each of the common electrode blocks is connected with at least one wire, and the wires are in middle of the sub-pixel units of a same column.

At least one embodiment of the present invention further provides a touch panel including the array substrate in the above-mentioned technical proposal.

At least one embodiment of the present invention further provides a manufacturing method of the array substrate in the above-mentioned technical proposal, the method including: forming a plurality of gate lines and a plurality of data lines on a base substrate; forming a common electrode layer on the base substrate such that the common electrode layer comprises a plurality of common electrode blocks that double as self-capacitance electrodes, and each of the common electrode blocks is connected with at least one wire; and forming a plurality of pixel units arranged in an array such that each of which comprising a plurality of sub-pixel units defined by the gate lines and the data lines disposed to intersect each other laterally and vertically, and the wires being located in middle of the sub-pixel units of a same column.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 2 is a connection relationship diagram of wires and common electrode blocks in FIG. 1a;

Figure 1A:
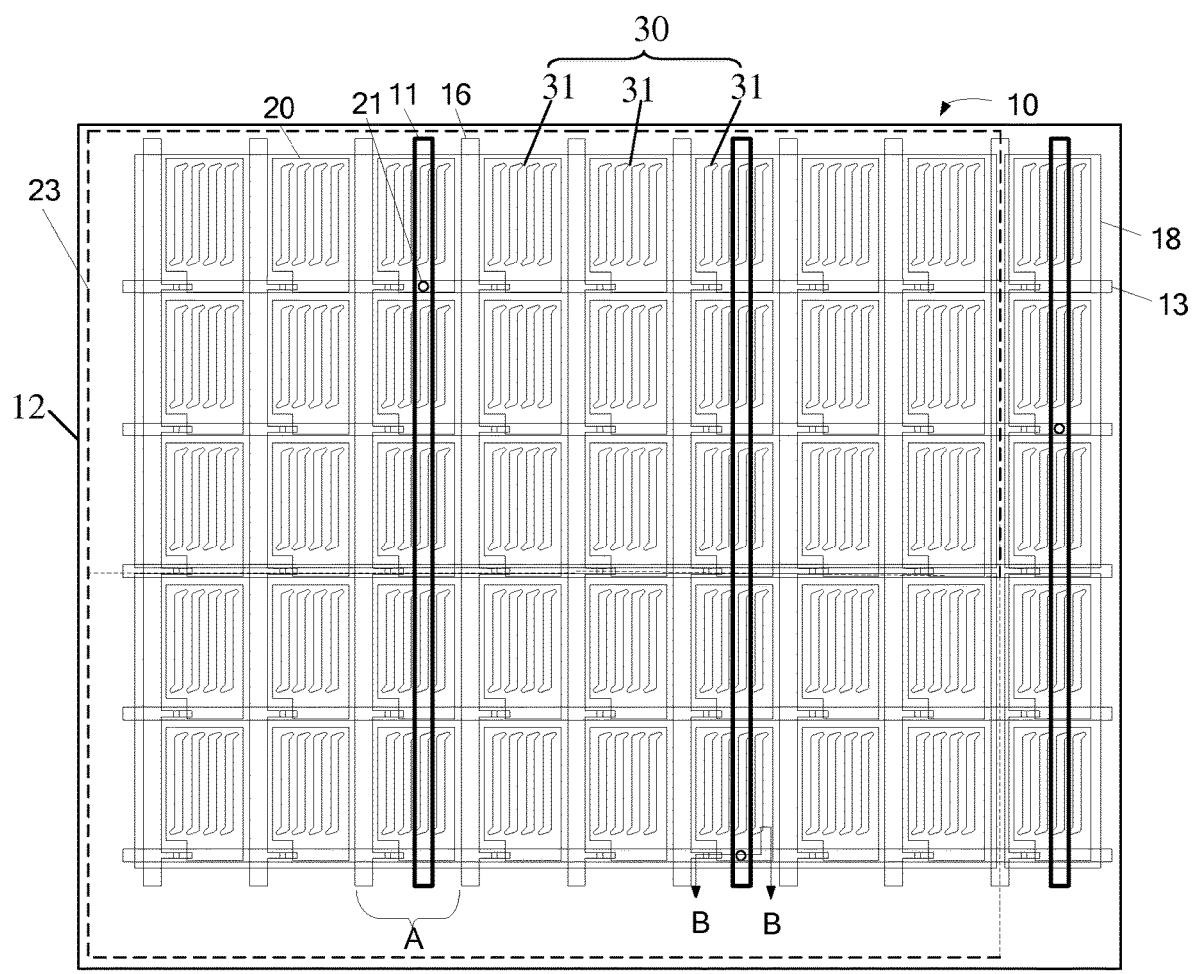
FIG. 1a is a structure diagram of an array substrate provided in an embodiment of the present invention.

Reference numerals: 10. Array substrate; 11. Wire; 12. Base substrate; 13. Gate line; 14. Gate insulating layer; 15. Active layer; 16. Data line 17. First protection layer; 18. Common electrode layer; 19. Second protection layer; 20. Pixel electrode; 21. First via; 22. Second via; 23. Common electrode block; 24. Gate line and gate electrode; 25. Source electrode; 26. Drain electrode; 27. Driving IC.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. Terms such as "first", "second" and the like used in the present disclosure do not indicate any sequence, quantity or significance but only for distinguishing different constituent parts. Similarly, terms such as "one", "a" or "the" do not mean to limit quantity, but denote the presence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the present application have noticed the following during study. A self-capacitance touch panel includes a plurality of pixel units. In a pixel unit, there is a space between a wire connected with the self-capacitance electrode and an adjacent data line. Wires and data lines are opaque by themselves. In order to prevent spaces between wires and data lines from leaking light, it is required that black matrix of the self-capacitance touch panel to cover data lines, wires and spaces therebetween, which leads to a large coverage by black matrix and in turn a reduced aperture ratio for pixel units.

Referring to FIG. 1a, the array substrate 10 provided in an embodiment of the present invention includes: a base substrate 12, a plurality of gate lines 13, a plurality of data lines 16, a common electrode layer 18 and a plurality of pixel units 30 arranged in an array disposed on the base substrate 12, wherein each pixel unit 30 includes a plurality of sub-pixel units 31 each defined by gate lines 13 and data lines 16 disposed to intersect each other in lateral and vertical directions; the common electrode layer 18 includes a plurality of common electrode blocks 23 that may double as self-capacitance electrodes, each common electrode block 23 is connected with at least one wire 11 and the wire 11 is located in the middle of sub-pixel units 31 of the same column (as illustrated in FIG. 1a). For example, as illustrated in FIG. 1a, sub-pixel units of column A share one wire 11 and the wire 11 is located in the middle of sub-pixel units of column A.

It is to be noted that sub-pixel units in the same column are mentioned with respect to the extending direction of wire 11, i.e., they refer to the sub-pixel units disposed at the place where the wire is located in the extending direction of wire 11. For the case illustrated in FIG. 1a, when the viewing angle is changed, the direction of the column in which sub-pixel units in the same column are located will change accordingly. Further, the middle of sub-pixel units refers to the middle region of sub-pixel units (namely opening region) with respect to periphery (blocked region) of sub-pixel units.

In at least one embodiment, wires and data lines or gate lines may be disposed in the same layer, which allows to form wires, data lines or gate lines by one patterning process. Alternatively, wires and data lines or gate lines may also be disposed in different layers. For example, while forming wires separately by one patterning process, or forming wires simultaneously with other layers such as the layer in which gate electrodes are located on the array substrate, wires and gate lines or data lines may be disposed in different layers.

Figure 10:
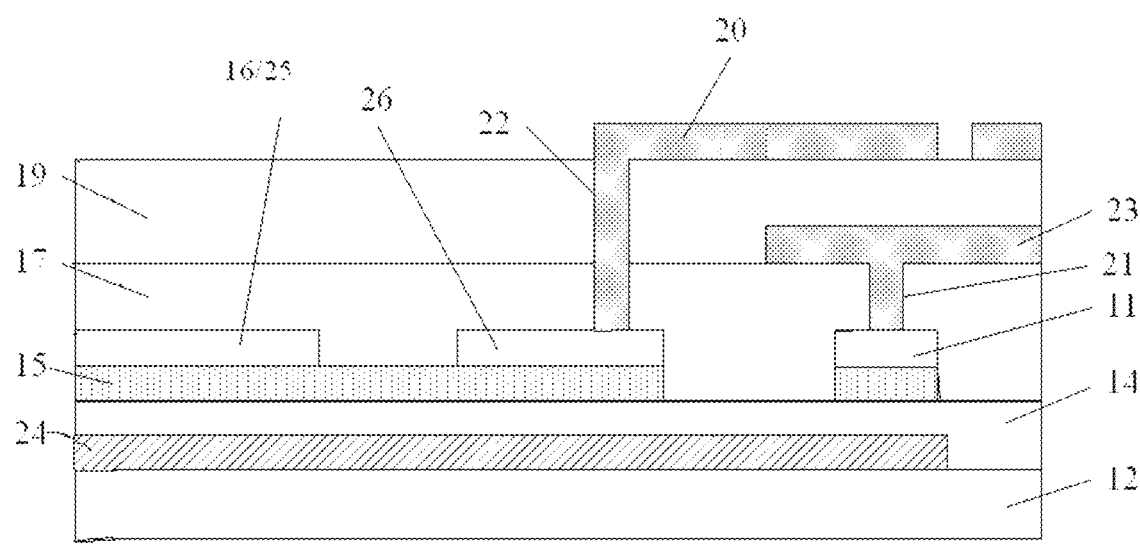
FIG. 10 is a sectional view in B-B direction in FIG. 9.

In the array substrate 10 provided in embodiments of the present invention, wires 11 connected with the common electrode layer 18 are located in the middle of sub-pixel units of the same column (for example, wires are disposed in regions on the base substrate where pixel electrodes of sub-pixel units and the common electrode blocks have common orthogonal projections). The middles of sub-pixel units belong to opening regions, while opening regions are not covered by black matrix. Therefore, the black matrix only needs to cover data lines (or gate lines 13). Since the wires 11 are thin, they are not visible even in sub-pixel units, it's not required to block wires 11, and spaces between data lines 16 (or gate lines 13) and wires 11 with the black matrix. Therefore, embodiments of the present invention can reduce the coverage of the black matrix, increase the area of opening region, and thereby increasing aperture ratio of the pixel units. And, in an embodiment of the present invention, wires 11 and data lines 16 (or layers on the array substrate originally such as gate lines 13) may be disposed in the same layer as shown in FIG. 10, which allows to form wires 11 and data lines 16 (or gate lines 13) with one patterning process in the manufacturing process of array substrate 10, thereby reducing one step of masking process.

There are various ways to dispose wires 11 in the above-mentioned array substrate, which, in an embodiment of the present invention, may include, but not limited to the following disposition ways.

In arrangement mode I, referring to FIG. 1a, each common electrode block 23 is connected with a wire 11 and sub-pixel units where the wire 11 is located belong to different pixel units. When wires 11 are disposed in this mode, one wire 11 will not appear in two or more sub-pixel units in the same one pixel unit and there is only one sub-pixel unit in a pixel unit that corresponds to the wire 11. For example, as illustrated in FIG. 1a, the part of pixel region of the array substrate illustrated in the figure includes 9 columns and 5 rows of sub-pixel units, and dashed lines denote regions corresponding to the common electrode block 23. In the present embodiment, the denoted region includes a top and a bottom common electrode blocks 23, each corresponding to 3*8=24 sub-pixel units. A row of sub-pixel units are omitted for the bottom common electrode block 23. It is understood that FIG. 1a is merely a schematic diagram. For example, each common electrode block 23 corresponds to the same number of sub-pixel units. One common electrode block 23 is connected with only one wire 11. The first three sub-pixel units in the first row of sub-pixel units constitute one pixel unit in which only one sub-pixel unit is provided with the wire 11.

Figure 2:
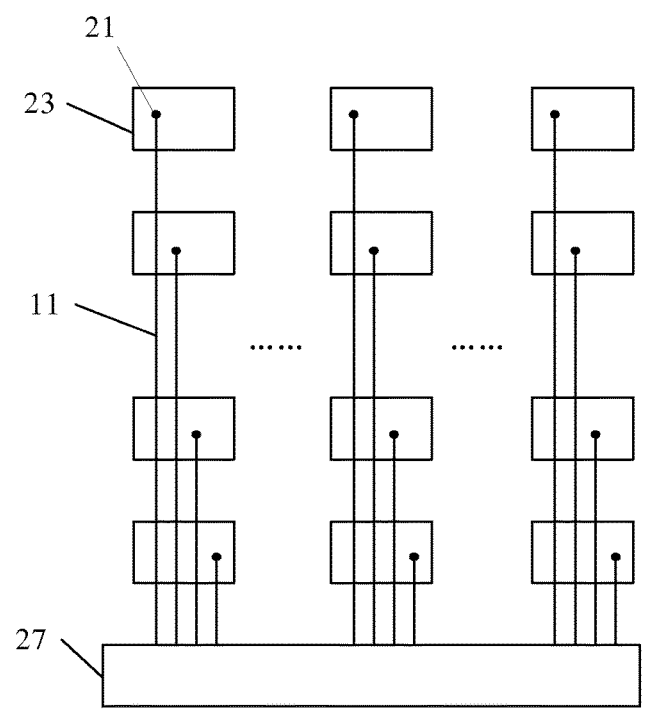

It is to be noted, the display device including the array substrate further includes a driver circuit or the driver circuit may be mounted directly on the array substrate. The driver circuit (hereafter referred to as simply Driving IC (Integrated circuit) 27) may be as illustrated in FIG. 2, and the driving IC 27 is configured to drive component for implementing touch function and/or components for implementing display function. The common electrode blocks 23 are connected with the driving IC 27 through wires 11. For example, referring to FIG. 2, one common electrode block 23 is connected with only one wire 11. Therefore, one common electrode block 23 is connected with the driving IC 27 through one wire 11.

Figure 1B:
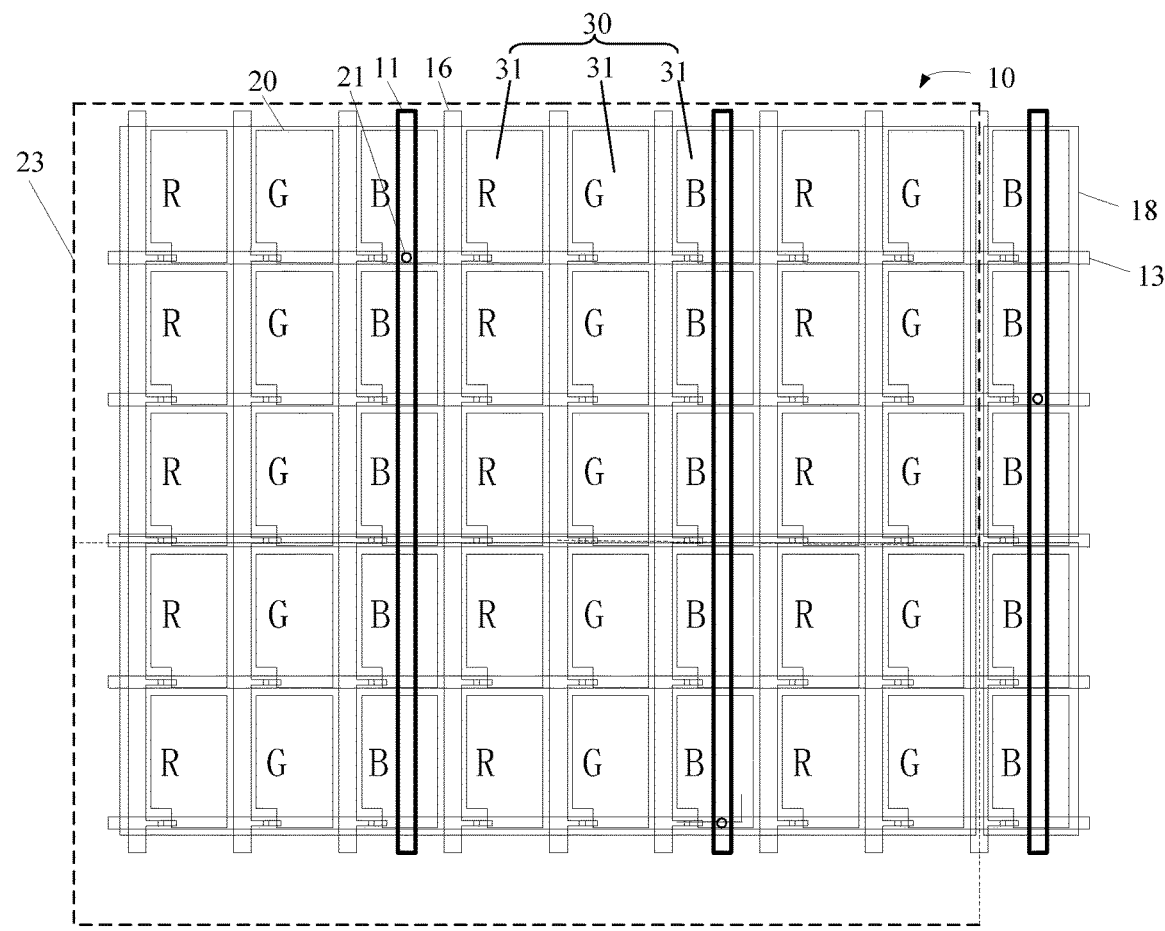
FIG. 1b is a structure diagram illustrating each pixel unit provided in an embodiment of the present invention including a red, a blue and a green sub-pixel units.

Furthermore, for example, as illustrated in FIG. 1b, each pixel unit includes at least a red (R), a blue (B) and a green (G) sub-pixel unit. In each pixel unit, the wire 11 that is connected with the common electrode is located in the middle of one of the red, blue and green sub-pixel units. For example, since the blue sub-pixel unit has the least influence on transmittance, the wire 11 that is connected with common electrode 18 is arranged in the middle of blue sub-pixel unit among the red, blue and green sub-pixel units. For example, each pixel unit includes a red, a blue and a green sub-pixel unit. The same one column of pixel units include three columns of sub-pixel units, namely a column of red sub-pixel units, a column of blue sub-pixel units and a column of green sub-pixel units, respectively. The wire 11 is disposed in the middle of blue sub-pixel units in the column of pixel units.

Figure 3:
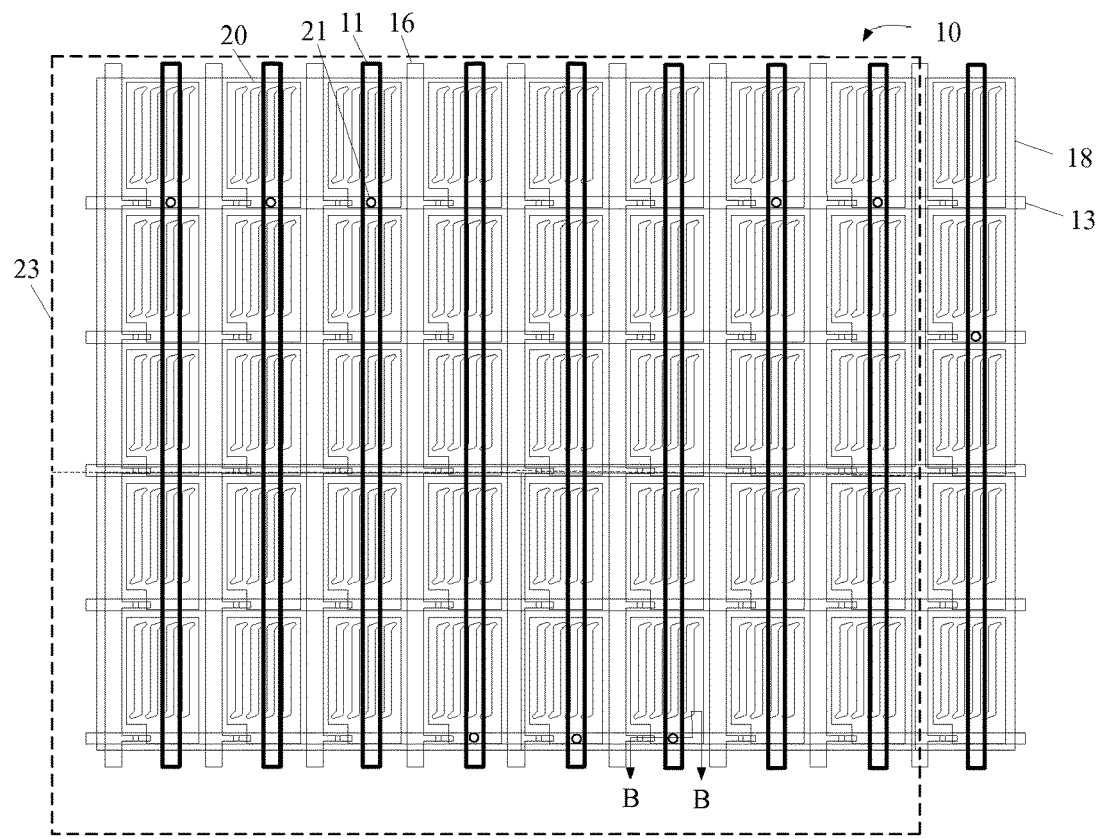
FIG. 3 is a structure diagram of another array substrate provided in an embodiment of the present invention.

In arrangement mode II, referring to FIG. 3, each common electrode block 23 is connected with a plurality of wires 11 and the middle of a plurality of sub-pixel units in each pixel unit correspond to wires 11, respectively. For example, as illustrated in FIG. 3, in the sub-pixel units of 9 columns and 5 rows as denoted, each common electrode block 23 corresponds to 3*8=24 sub-pixel units. Therefore, in order for the columns of sub-pixel units to all have wires 11 passing through in their middle, a wire 11 is disposed in the middle of sub-pixel units for all the 8 columns. With such a design, it is possible to choose one wire 11 to transmit signals while driving and other wires 11 are used as standby wires, which can realize redundancy design of the driving circuit to enhance reliability of driving.

Figure 4:
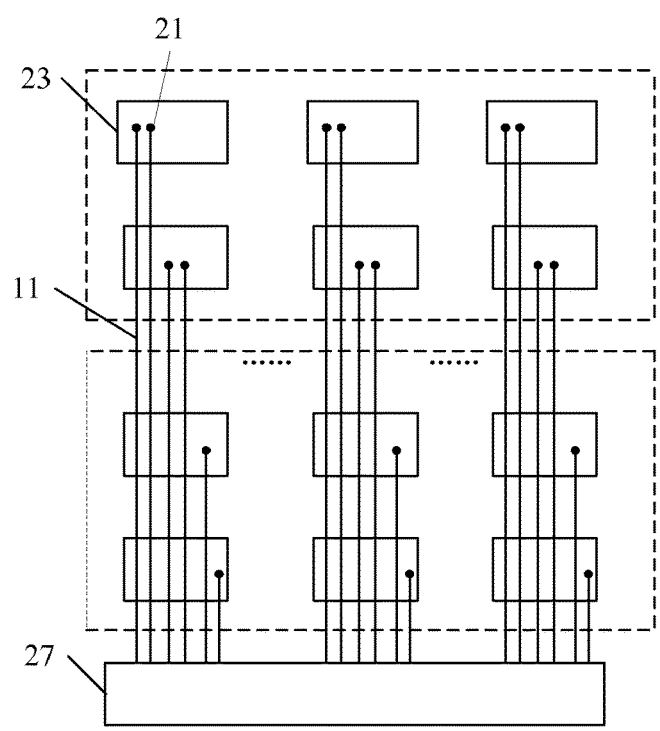
FIG. 4 is a connection relationship diagram of wires and common electrode blocks in another embodiment.

In arrangement mode III, referring to FIG. 4, in order to reduce the delay caused by signal transmission in the driving process, for example, the common electrode block 23 located at the distal end of the driving IC 27 is connected with the driving IC 27 through a plurality of wires 11, and the remaining common electrode blocks 23 located at the proximal end of driving IC 27 are connected with the driving IC 27 through one wire 11. For example, referring to FIG. 4, the common electrode blocks 23 in the top dashed box are those at distal end of driving IC 27 and are connected with the driving IC 27 through two wires 11. The common electrode blocks 23 in the bottom dashed box are those located at the proximal end of driving IC and are connected with the driving IC through one wire 11. With such a design, on the one hand, it is possible to reduce delay caused by signal transmission in the driving process, and on the other hand, the number of wires 11 may be reduce as compared to the arrangement mode II.

The distal end in the present embodiment is described in terms of the distance from a common electrode block to the driving IC 27. The end apart from the driving IC 27 is referred to as distal end, and the end close to the IC 27 is referred to as proximal end. For example, if there are 20 rows of pixel units and 10 rows of common electrode blocks disposed from top to bottom on the entire array substrate, it is possible to use the common electrode block in the middle position as a reference point, the first two or three rows on the top are referred to as common electrode blocks at distal end of the driving IC 27, while the other rows are referred to as common electrode blocks at proximal end of the driving IC 27. Of course, the numbers of common electrode blocks at the distal and proximal ends may be set according to practical requirement, which will not be described any more here.

It should be noted that since the common electrode blocks 23 may double as self-capacitance electrodes, a common electrode block 23 corresponds to a plurality of sub-pixel units in any of the above embodiments. For example, as illustrated in FIG. 1a, a common electrode block 23 corresponds to 3*8=24 sub-pixel units. In at least one embodiment, the shape of common electrode blocks 23 may be for example square, rectangle, diamond or other regular polygons. For example, the common electrode blocks 23 are square electrode blocks with sides of 4 mm-5 mm.

Figure 5:
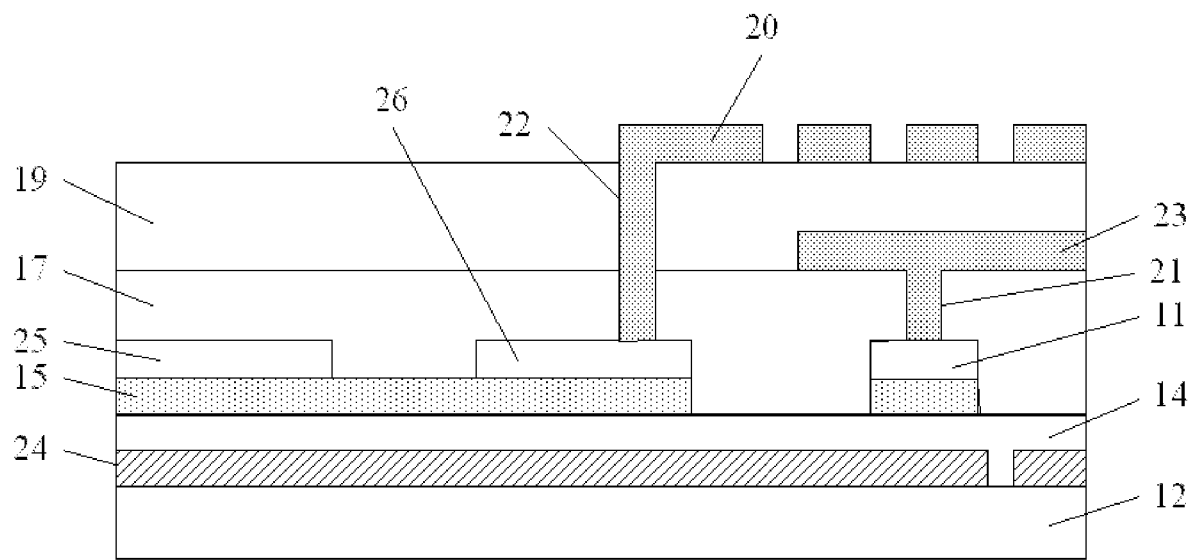
FIG. 5 is a sectional view in B-B direction in FIG. 1a or 3.

In at least one embodiment, the wire 11 may be located under the common electrode layer 18, or over the common electrode layer 18 (for example, wire formed with separate patterning process). For example, the array substrate 10 may further include a first protection layer 17 disposed above the wire 11, and the common electrode layer 18 may be disposed on the first protection layer 17, as illustrated in FIG. 5. Alternatively, the array substrate 10 may include a first protection layer disposed on the common electrode layer and the wires are disposed on the first protection layer.

Taking the case illustrated in FIG. 5 as an example, in addition to the above-mentioned structure, the array substrate 10 in embodiments of the present invention may further include a gate insulating layer 14 disposed on the plurality of gate lines 13, an active layer 15 disposed on the gate insulating layer 14, a plurality of data lines 16 and wires 11 disposed on the active layer 15, a first protection layer 17 disposed on the plurality of data lines 16 and wires 11, a common electrode layer 18 disposed on the first protection layer 17, a second protection layer 19 disposed on the first protection layer 17 and the common electrode layer 18, and pixel electrodes 20 disposed on the second protection layer 19.

The specific structure of the above-mentioned array substrate 10 will be explained below with respect to the sub-pixel unit in array substrate 10 as an example.

For example, referring to FIG. 5, the sub-pixel units include a gate layer 24 disposed on the base substrate 12 (since the gate lines 13 and the gate electrodes are formed of the same layer of metal, 24 in the figure denotes gate lines 13 and gate electrodes and this layer will be referred to as a gate layer hereinbelow), a gate insulating layer 14 disposed on the gate layer 24, an active layer 15 disposed on the gate insulating layer 14, source electrode 25/drain electrode 26 and wires 11 disposed on the active layer 15, a first protection layer 17 disposed on the source electrode 25/drain electrode 26 and the wires 11, a common electrode layer 18 disposed on the first protection layer 17, a second protection layer 19 disposed on the first protection layer 17 and the common electrode layer 18, and pixel electrodes 20 disposed on the second protection layer 19. It is to be noted that the common electrode layer 18 includes a plurality of common electrode blocks.

In the above-mentioned array substrate 10, the common electrode blocks 23 in the common electrode layer 18 are connected with the wires 11. For example, referring to FIGS. 1a, 3 and 5, first vias 21 are provided in the first protection layer 17 in the array substrate through which the common electrode blocks 23 are connected with the wires 11. The vias 21 through which the wires 11 and the common electrode blocks are connected in the figure are only one connection mode. The present application includes, but not limited to this connection mode. In addition, second vias 22 are provided in the second protection layer 19 in the array substrate 20, through which the pixel electrodes 20 are connected with the drain electrodes 25.

To facilitate patterning, as illustrated in FIG. 2 or 4, in at least one embodiment, projections of first vias 21 corresponding to the common electrode blocks 23 in the same column on the base substrate are staggered successively. Thus, it is both convenient to form first vias 21 by patterning, and convenient to form the wires 11 by patterning. It is to be noted that common electrode blocks in the same column are mentioned with respect to the extending direction of the wires, i.e., they refer to the common electrode blocks disposed at the wires along the extension direction of wires 11. For cases illustrated in FIG. 2 or 4, when the viewing angle is changed, the direction of column in which common electrode blocks in the same column are located changes accordingly.

At least one embodiment of the present invention further provides a touch panel including the above-mentioned array substrate 10. The touch panel may be applied to any products or components with display function such as liquid crystal display panels, electronic paper, organic light emitting diode (OLED panel), cellphones, tablet computers, TV sets, displays, notebook computers, digital picture frames, and navigators.

Figure 6:
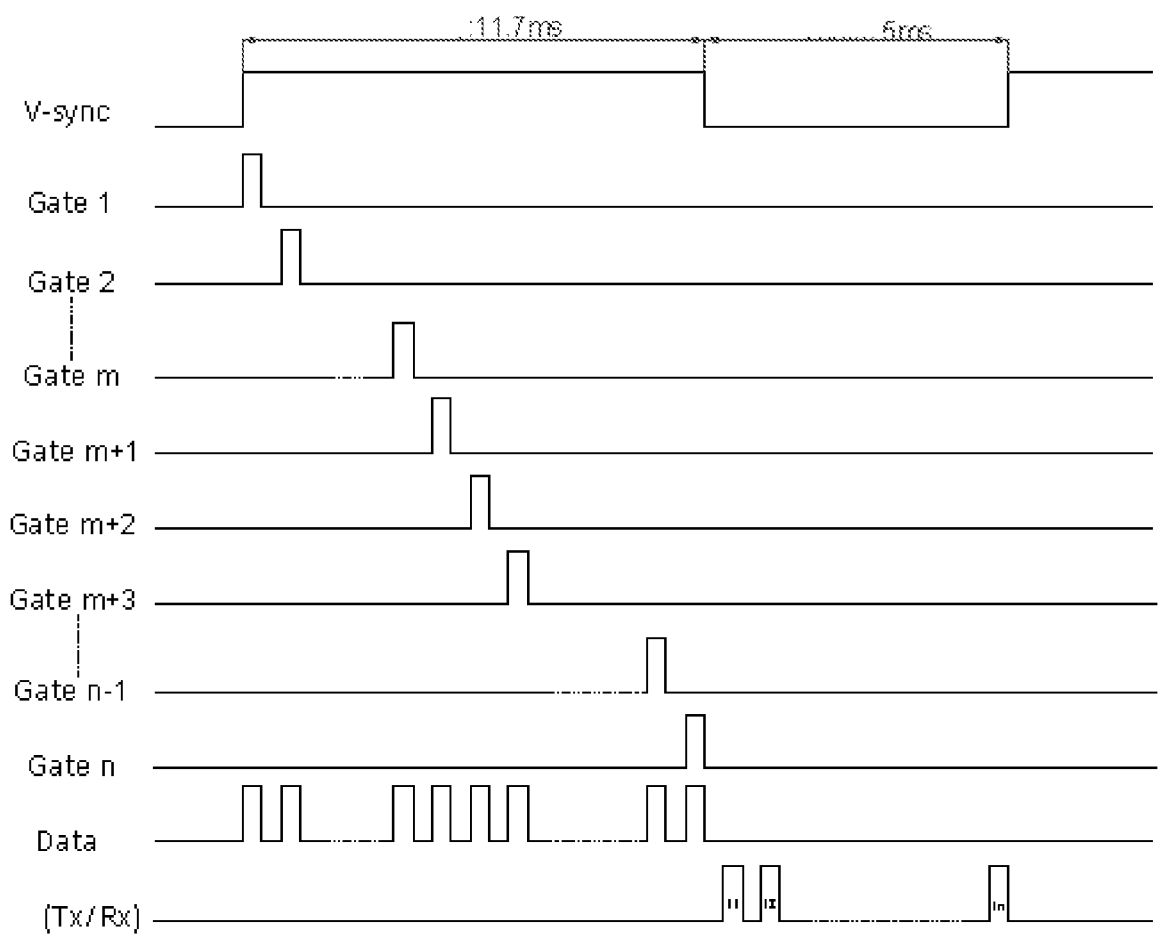
FIG. 6 is a timing diagram for a time-division-driven touch panel provided in an embodiment of the present invention.

Since the touch panel in the above-mentioned embodiments combines touch function and display function, it can implements touch function and display function. In order to prevent touch signals received by common electrode blocks doubling as self-capacitance electrodes from being influenced by gate lines and data lines for implementing display function in the array substrate while implementing touch function, the touch panel is generally driven in a time-division manner. For example, in the total driving period T for 1 frame of signals, interval T1 is used to drive display function, interval T2 is used to drive touch function, wherein T=T1+T2. For example, referring to FIG. 6, the total driving period T for 1 frame of signals is 16.7 ms, T1 is 11.7 ms, T2 is 5 ms, the first 11.7 ms in the frame is used to drive display function, and the latter 5 ms of the above-mentioned 1 frame of signals is used to drive touch function. In FIG. 6, Gate 1 to Gate n are gate line signals, Data is data line signals, Tx/Rx is signal for driving touch function by common electrode blocks doubling as self-capacitance electrodes.

Figure 7:
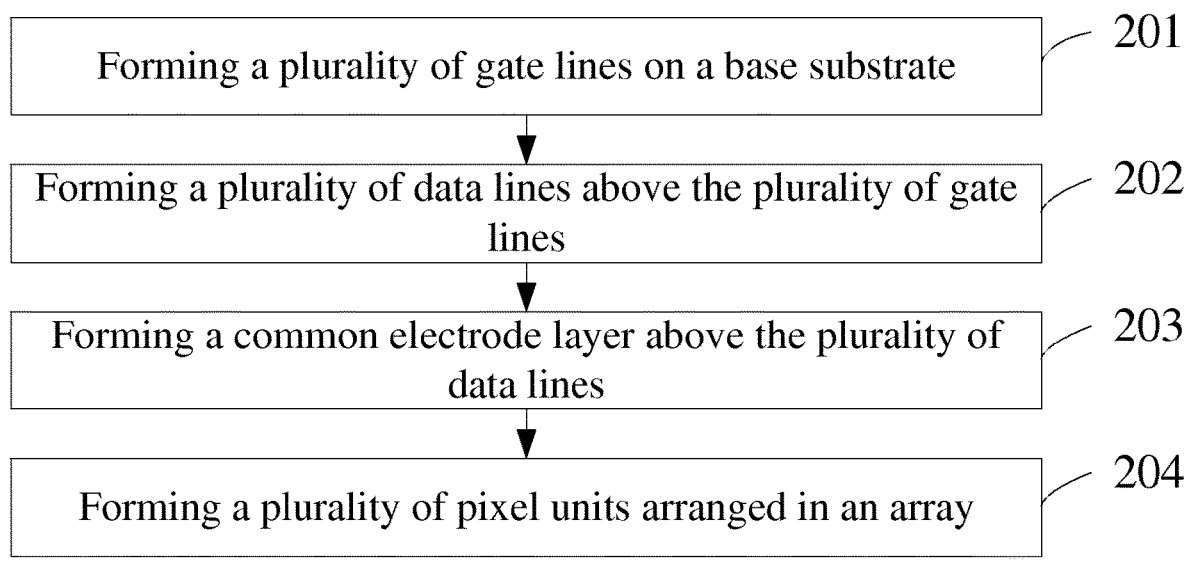
FIG. 7 is a flow chart of a manufacturing method of an array substrate provided in an embodiment of the present invention.

As illustrated in FIG. 7, at least one embodiment of the present invention further provides a manufacturing method of the above-mentioned array substrate, including the following steps 201 to 204, which will be described in detail below.

In step 201, a plurality of gate lines 13 are formed on the base substrate 12. For example, a gate line layer is formed first on the base substrate 12, and then the pattern including a plurality of gate lines 13 is formed by a patterning process.

In step 202, a plurality of data lines 16 are formed on the base substrate 12 (for example, above the plurality of gate lines 13). For example, a data line layer is formed first on the plurality of gate lines 13, and then the pattern including a plurality of data lines 16 is formed by a patterning process.

In step 203, a common electrode layer 18 is formed on the base substrate 12 (for example, above the plurality of data lines 16), which includes a plurality of common electrode blocks 23 that double as self-capacitance electrodes and each of which is connected with at least one wire 11. For example, the wires 11 and the data lines 16 are disposed in the same layer. Therefore, the data lines 16 and the wires 11 may be formed with one patterning process in the manufacturing process of array substrate 10.

In step 204, a plurality of pixel units arranged in an array are formed; each of which includes a plurality of sub-pixel units defined by the gate lines 13 and the data lines 16 disposed to intersect each other laterally and vertically; and the wires 11 are located in the middle of the sub-pixel units of the same column.

In the manufacturing method of array substrate provided in the embodiment of the present invention, the wires and the data lines (or the gate lines) may be disposed in the same layer such that they can be formed in one and the same patterning process, thereby reducing one masking step. Of course, the wires and the data lines (or the gate lines) may also be disposed in different layers.

In embodiments of the present invention, in the process of manufacturing the array substrate 10, the wires 11 connected with common electrodes 18 are manufactured in the middle of sub-pixel units of the same column which belong to opening regions not covered by the black matrix, and the black matrix only needs to cover the data lines 16 (or the gate lines 13), but not to cover the wires 11, and spaces between the data lines 16 (or the gate lines 13) and the wires 11. Therefore embodiments of the present invention can reduce the coverage of black matrix, increase the area of opening regions, and in turn increase the aperture ratio of pixel units. In an embodiment of the present invention, in the process of manufacturing array substrate 10, the wires 11 connected with the common electrode blocks and the data lines 16 (or gate lines 13) are disposed in the same layer. In the process of manufacturing the array substrate 10, the data lines 16 (or the gate lines 13) and the wires 11 may be formed by one patterning process, thereby reducing the masking step of separately shaping wires 11, namely reducing one masking step.

Figure 8:
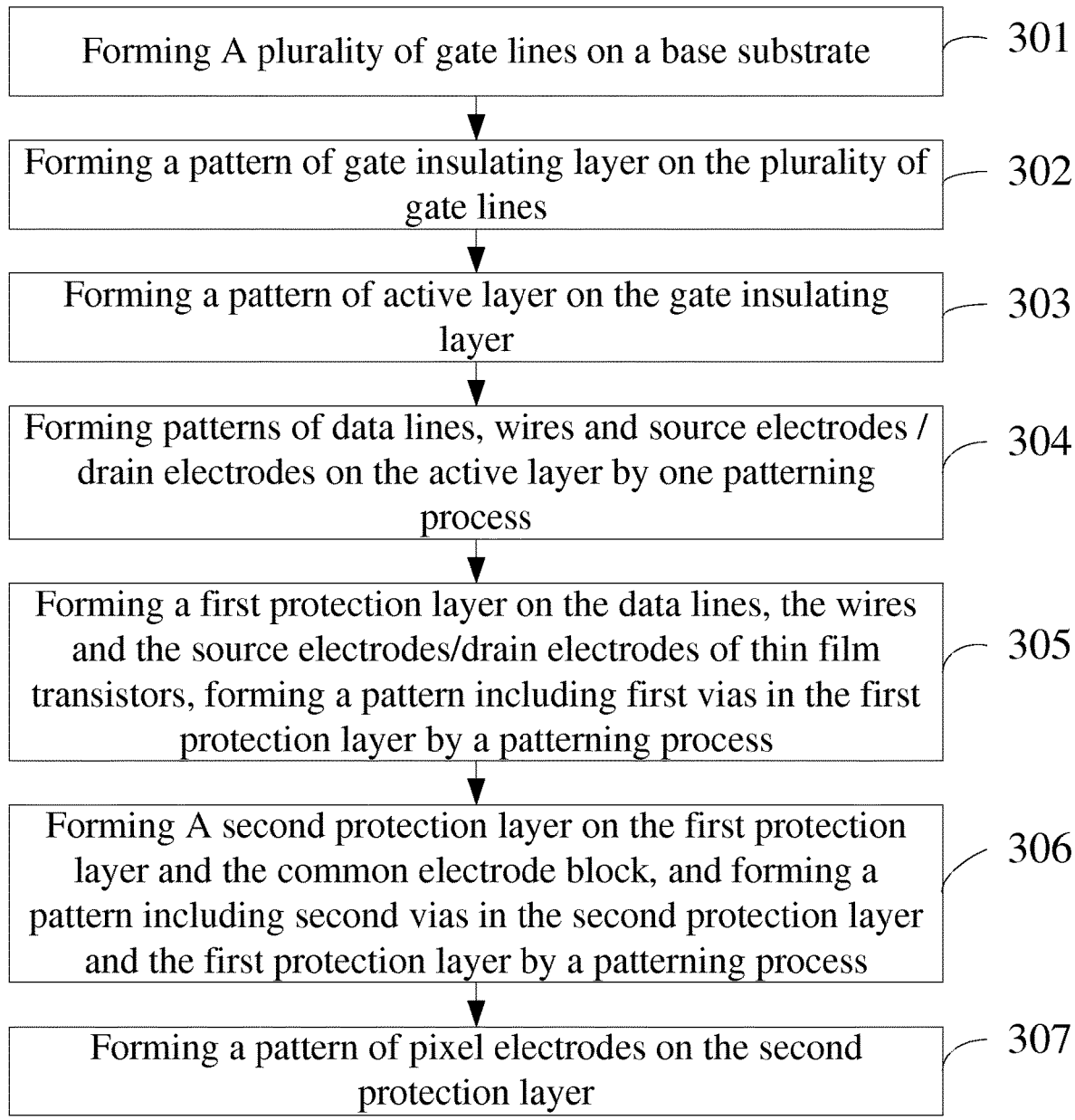
FIG. 8 is a flow chart of a specific implementation of the manufacturing method of an array substrate provided in an embodiment of the present invention.
Figure 9:
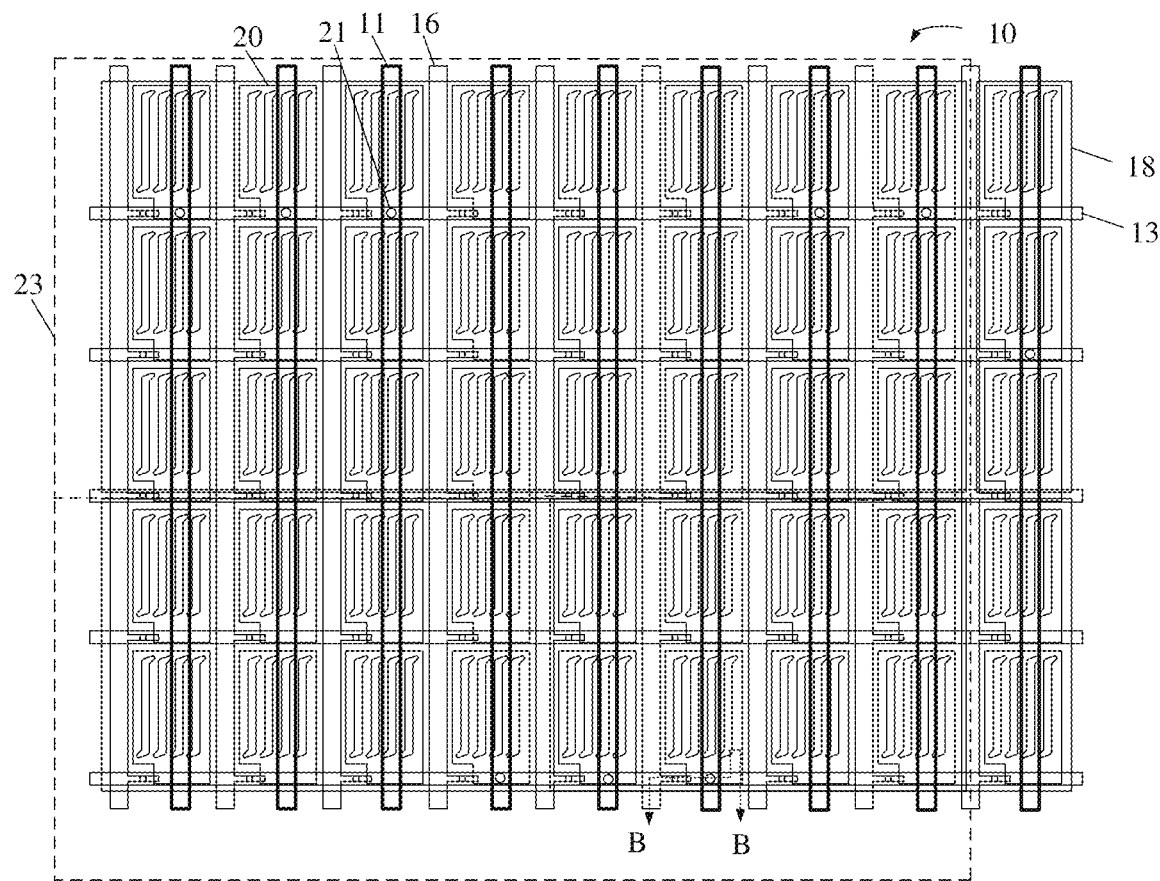
FIG. 9 is a structure diagram of another array substrate provided in an embodiment of the present invention.

The manufacturing process of array substrate 10, particularly the manufacturing method of sub-pixel units in array substrate 10 will be explained in detail below with reference to FIG. 5. As illustrated in FIG. 8, the manufacturing method of the array substrate 10 includes, for example, the following steps 301 to 307.

In step 301, a plurality of gate lines 13 are formed on the base substrate 12. For example, while forming a plurality of gate lines 13, gate electrodes in thin film transistors 23 are also formed.

In step 302, a pattern of gate insulating layer 14 is formed on the plurality of gate lines 13. It is to be noted that, each of the thin film transistors 23 having a gate electrode under the gate insulating layer 14 is described as an example in the embodiment of the present invention.

In step 303, a pattern of active layer 15 is formed on the gate insulating layer 14, which includes regions corresponding to source electrodes 25, drain electrodes 26 and channels between source electrodes/drain electrodes to be formed and regions corresponding to the wires 11 to be formed.

In step 304, patterns of data lines 16, wires 11 and source electrodes 25/drain electrodes 26 are formed on the active layer 15 by one patterning process. It is possible to form the data lines 16, the wires 11 and the source electrodes 25/drain electrodes 26 by one patterning process, that is, step 304 may be accomplished with one masking process.

In step 305, a first protection layer 17 is formed on the data lines 16, the wires 11 and the source electrodes 25/drain electrodes 26 of thin film transistors 23, a pattern including first vias 21 is formed in the first protection layer 17 by a patterning process, wherein the common electrode blocks 23 are located on the first protection layer 17 and connected with the wires 11 through the first vias 21.

In step 306, a second protection layer 19 is formed on the first protection layer 17 and the common electrode block 23, and a pattern including second vias 22 is formed in the second protection layer 19 and the first protection layer 17 by a patterning process.

In step 307, a pattern of pixel electrodes 20 is formed on the second protection layer 19, wherein the pixel electrodes 20 are connected with the drain electrodes 26 through the second vias 22.

Since the wires 11 and the data lines 16 are disposed in the same layer, after forming the data line layer on the gate insulating layer 14, a pattern of data lines 16 and wires 11 is formed by one patterning process, no separate masking step is needed for the wires 11, which saves one masking step, reducing the number of masking in the manufacturing process of array substrate 10, and simplifying the manufacturing flow of array substrate 10.

In the above description of implementations, specific features, structures, materials or characteristics may be combined as appropriate in any one or more of embodiments or examples.

What are described above is related to the illustrative embodiments of the disclosure only and not limitative to the scope of the disclosure; the scopes of the disclosure are defined by the accompanying claims.

The present application claims priority of China Patent application No. 201510041311.7 filed on Jan. 27, 2015, the content of which is incorporated in its entirety as part of the present application by reference herein.

The invention claimed is:

1. An array substrate comprising:
a base substrate; and
a plurality of gate lines, a plurality of data lines, a common electrode layer, and a plurality of pixel units, arranged in an array disposed on the base substrate, wherein
each of the pixel units comprises a plurality of sub-pixel units defined by the gate lines and the data lines disposed to intersect each other laterally and vertically, and the plurality of sub-pixel units comprise a plurality of wires;
the common electrode layer comprises a plurality of common electrode blocks that double as self-capacitance electrodes, each of the common electrode blocks is connected to at least one corresponding wire of the plurality of wires; and
wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units, the common electrode blocks are connected with the wires through vias, the wires extend to a driving circuit which drives a touch function and a display function, an orthographic projection of the at least one corresponding wire on the base substrate and an orthographic projection of pixel electrodes of the column of the sub-pixel units at least partially overlap, a width of the wire in a direction of the row of the sub-pixel units is less than a width of the pixel electrode in the direction of the row of the sub-pixel units in a region where the orthographic projection of the at least one of the wires on the base substrate and the orthographic projection of pixel electrodes of the column of the sub-pixel units overlap, each of the common electrode blocks is connected with one of the wires, and the pixel unit comprises at least a red sub-pixel unit, a blue sub-pixel unit, and a green sub-pixel unit, sub-pixel units with a same color at which the wires are located belong to different ones of the pixel units, a same column of the sub-pixel units has a same color, a same row of the sub-pixel units are arranged in a sequence of red, green, and blue; and the wires are disposed in blue sub-pixel units, an extending direction of the wires is the same as an extending direction of the column of the blue sub-pixel units, and the wires run through all pixel electrodes of the column of the blue sub-pixel units, and wherein only one wire is disposed in each pixel unit.

2. The array substrate of claim 1, wherein for each of the common electrode blocks that are connected via more than one of the wires, the more than one of the wires are located in corresponding middle parts of the corresponding plurality of the sub-pixel units in each of the pixel units.

3. The array substrate of claim 1, wherein one of the common electrode blocks corresponds to a plurality of the sub-pixel units.

4. The array substrate of claim 1, wherein the common electrode blocks have at least one or more shapes comprising a square, a rectangle, a diamond or other regular polygon.

5. The array substrate of claim 1, wherein the common electrode blocks are square electrode blocks with sides of 4 mm-5 mm.

6. The array substrate of claim 1, further comprising:
a first protection layer disposed on the wires, wherein the common electrode layer is disposed on the first protection layer; or
a first protection layer disposed on the common electrode layer, wherein the wires are disposed on the first protection layer.

7. The array substrate of claim 6, wherein the first protection layer is provided with first vias through which the common electrode blocks are connected with the wires.

8. The array substrate of claim 7, wherein projections of the first vias corresponding to the common electrode blocks in a same column on the base substrate are staggered successively.

9. The array substrate of claim 1, further comprising:
a gate insulating layer disposed on the plurality of gate lines;
an active layer disposed on the gate insulating layer, wherein the plurality of data lines and the wires are disposed on the active layer;
a first protection layer disposed on the plurality of data lines and the wires, wherein the common electrode layer is disposed on the first protection layer;
a second protection layer disposed on the first protection layer and the common electrode layer; and
pixel electrodes disposed on the second protection layer.

10. A touch panel comprising the array substrate according to claim 1.

11. The array substrate of claim 1, wherein each of common electrode blocks among the common electrode blocks that are located at a distal end of the driving circuit is connected with the driving circuit through a plurality of the wires, each of remaining ones of the common electrode blocks that are located at a proximal end of the driving circuit is connected with the driving circuit through one of the wires.

12. The array substrate according to claim 1, further comprises a gate insulating layer disposed on the plurality of gate lines; and an active layer disposed on the gate insulating layer, wherein the gate insulating layer, the active layer and the wire are disposed in a direction perpendicular to the base substrate and the wire is directly in contact with the active layer.

13. The array substrate of claim 1, wherein the pixel electrode has four slits, the wire corresponds to one of the four slits in position, and in the region where the orthographic projection of the at least one of the wires on the base substrate and the orthographic projection of pixel electrodes of the column of the sub-pixel units overlap, an orthographic projection of one of the four slits entirely falls within the orthographic projection of the at least one of the wires on the base substrate and orthographic projections of three other of the four slits do not fall within the orthographic projection of the at least one of the wires on the base substrate.

14. The array substrate of claim 1, wherein the wires are only disposed in blue sub-pixel units.

15. A manufacturing method of an array substrate, comprising:
forming a plurality of gate lines and a plurality of data lines on a base substrate;
forming a common electrode layer on the base substrate, wherein the common electrode layer comprises a plurality of common electrode blocks that double as self-capacitance electrodes; and
forming a plurality of pixel units arranged in an array, each of the pixel units comprising a plurality of sub-pixel units defined by the gate lines and the data lines disposed to intersect each other laterally and vertically, and the sub-pixel units comprising a plurality of wires, each of the common electrode blocks being connected to at least one corresponding wire of the plurality of wires,
wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units, the common electrode blocks are connected with the wires through vias, the wires extend to a driving circuit which drives a touch function and a display function, an orthographic projection of the at least one corresponding wire on the base substrate and an orthographic projection of pixel electrodes of the column of the sub-pixel units at least partially overlap, a width of the wire in a direction of the row of the sub-pixel units is less than a width of the pixel electrode in the direction of the row of the sub-pixel units in a region where the orthographic projection of the at least one of the wires on the base substrate and the orthographic projection of pixel electrodes of the column of the sub-pixel units overlap, each of the common electrode blocks is connected with one of the wires, and the pixel unit comprises at least a red sub-pixel unit, a blue sub-pixel unit, and a green sub-pixel unit, the sub-pixel units with a same color at which the wires are located belong to different ones of the pixel units, a same column of the sub-pixel units has a same color, a same row of the sub-pixel units are arranged in a sequence of red, green, and blue; and the wires are disposed in blue sub-pixel units, an extending direction of the wires is the same as an extending direction of the column of the blue sub-pixel units, and the wires run through all pixel electrodes of the column of the blue sub-pixel units, and wherein only one wire is disposed in each pixel unit.

16. The manufacturing method of the array substrate of claim 15, wherein forming the plurality of pixel units comprises:
forming a pattern of a gate insulating layer on the plurality of gate lines;
forming a pattern of an active layer on the gate insulating layer, the active layer comprising regions corresponding to source electrodes, drain electrodes, and channels between the source electrodes and the drain electrodes to be formed and regions corresponding to the wires to be formed;
forming patterns of the data lines, the wires, the source electrodes, and the drain electrodes on the active layer by one patterning process;
forming a first protection layer on the data lines, the wires, the source electrodes, and the drain electrodes, forming a pattern comprising first vias in the first protection layer by a patterning process, the common electrode blocks being located on the first protection layer and connected with the wires through the first vias;
forming a second protection layer on the first protection layer and the common electrode blocks, and forming a pattern comprising second vias in the second protection layer and the first protection layer by a patterning process; and
forming a pattern of pixel electrodes on the second protection layer, the pixel electrodes being connected with the drain electrodes through the second vias.

17. The manufacturing method of the array substrate of claim 15, wherein each of common electrode blocks among the common electrode blocks that are located at a distal end of the driving circuit is connected with the driving circuit through a plurality of the wires, each of remaining ones of the common electrode blocks that are located at a proximal end of the driving circuit is connected with the driving circuit through one of the wires.

18. An array substrate comprising:
a base substrate; and
a plurality of gate lines, a plurality of data lines, a common electrode layer, and a plurality of pixel units, arranged in an array disposed on the base substrate, wherein
each of the pixel units comprises a plurality of sub-pixel units defined by the gate lines and the data lines disposed to intersect each other laterally and vertically, and the plurality of sub-pixel units comprise a plurality of wires;
the common electrode layer comprises a plurality of common electrode blocks that double as self-capacitance electrodes, each of the common electrode blocks is connected to at least one corresponding wire of the plurality of wires, the common electrode blocks are connected with the wires through vias, an orthographic projection of the vias on the base substrate substantially falls within an orthographic projection of the gate lines on the base substrate, and
wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units, the wires extend to a driving circuit, an orthographic projection of the at least one corresponding wire on the base substrate and an orthographic projection of pixel electrodes of the column of the sub-pixel units at least partially overlap, the pixel unit comprises at least a red sub-pixel unit, a blue sub-pixel unit, and a green sub-pixel unit, a same column of the sub-pixel units has a same color, a same row of the sub-pixel units are arranged in a sequence of red, green, and blue; and the wires are disposed in the blue sub-pixel units, an extending direction of the wires is the same as an extending direction of the column of the blue sub-pixel units, and the wires run through all pixel electrodes of the column of the blue sub-pixel units, and wherein only one wire is disposed in each pixel unit.

19. The array substrate according to claim 18, wherein the wires are further disposed in the red sub-pixel units and the blue sub-pixel units, an extending direction of the wires is the same as an extending direction of the column of the red sub-pixel units and green sub-pixel units, and the wires run through all of the pixel electrodes of the column of the blue sub-pixel units and the red sub-pixel units.

* * * * *